United States Patent [19]

Lacombat et al.

[11] 4,172,656

[45] Oct. 30, 1979

[54] METHOD OF POSITIONING A THIN SEMICONDUCTOR PLATE AND PATTERNS TO BE PROJECTED THEREON IN A PHOTOREPEATER AND A PHOTOREPEATER FOR CARRYING OUT THIS METHOD

[75] Inventors: Michel Lacombat; Marcel Chartier; Georges Dubroeucq, all of Paris, France

[73] Assignee: Thomson-CSF, Paris, France

[21] Appl. No.: 897,167

[22] Filed: Apr. 17, 1978

[30] Foreign Application Priority Data

Apr. 20, 1977 [FR] France ............................. 77 11908

[51] Int. Cl.² ..................... G03B 27/42; G03B 27/32
[52] U.S. Cl. ........................................ 355/53; 355/77
[58] Field of Search ................. 250/201; 355/53, 77, 355/95, 125, 132, 133

[56] References Cited

U.S. PATENT DOCUMENTS

| | | | |
|---|---|---|---|
| 3,476,476 | 11/1969 | Chitayat | 355/53 X |
| 3,602,591 | 8/1971 | Bouwer et al. | 355/53 |
| 3,838,274 | 9/1974 | Doubek et al. | 250/201 |
| 3,844,655 | 10/1974 | Johannsmeier | 355/77 X |

OTHER PUBLICATIONS

I.B.M. Technical Disclosure Bulletin, vol. 7, No. 4, Sep. 1964, pp. 329–330.

*Primary Examiner*—Donald A. Griffin
*Attorney, Agent, or Firm*—Cushman, Darby & Cushman

[57] ABSTRACT

The method consists in recording at least one reference mark on each of the patterns corresponding to the various levels of the circuit at a fixed point, in recording the reference mark of the first pattern in the semiconductor plate at the same time as the first pattern and then, after each positioning of the thin plate after the chemical treatments, in centering, by displacing the thin plate relative to the pattern, the images in the plane of the following pattern of at least two reference marks situated in the different zones with the complementary reference mark carried by the following pattern to be projected, the thin plate then being aligned with the following pattern to be projected.

9 Claims, 3 Drawing Figures

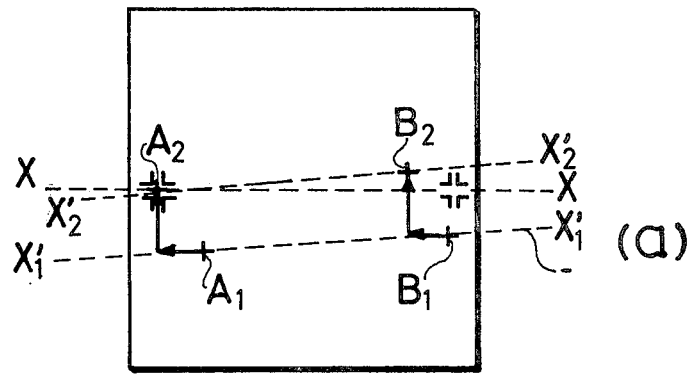
(a)
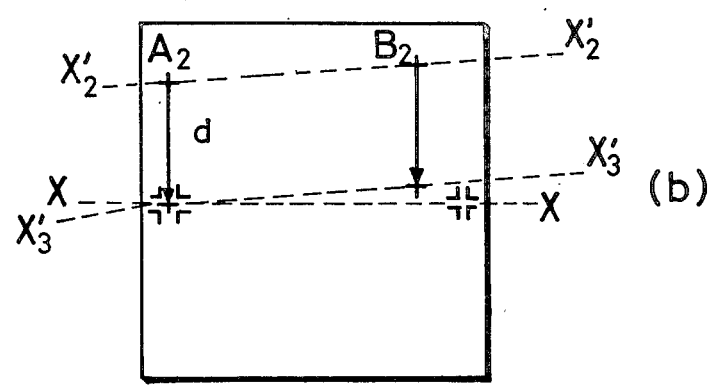
(b)
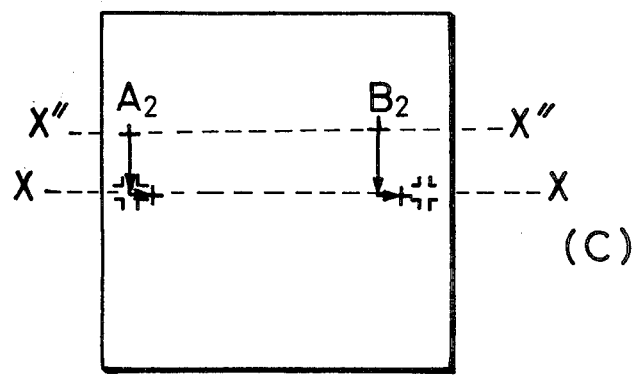
(c)
Fig. 3

METHOD OF POSITIONING A THIN SEMICONDUCTOR PLATE AND PATTERNS TO BE PROJECTED THEREON IN A PHOTOREPEATER AND A PHOTOREPEATER FOR CARRYING OUT THIS METHOD

This invention relates to the production of semiconductor components by the direct photorepetition on a thin semiconductor plate of several levels of the circuit produced from patterns on a larger scale and, more particularly, to a method for aligning in a photorepeater a thin semiconductor plate and the patterns to be projected thereon and to a photorepeater for carrying out this method.

In the technique of producing circuits by direct photorepetition, each pattern is directly projected onto the thin semiconductor plate covered beforehand with a layer of photoresist in accordance with a pre-established programme, the position of the plate being controlled by interferometry in each direction. Normally photorepetition is carried out by moving the plate and (or) the beam in two orthogonal directions X and Y. During the first exposure of the plate, there is no positioning problem, except that the successively exposed zones have to be parallel to the plane of the pattern to be projected (in which case a positional correction may have to be made if the plate is not perfectly flat). During the subsequent exposures, however, it is absolutely necessary for the patterns being projected to be centered and aligned relative to the patterns previously projected for all the zones of the plate.

This is because, during the projection of another pattern for forming another level of the circuit, the plate has to be returned to the same position which it occupied during the first exposure to ensure correct superposition of the various patterns. To this end, the plate has to be centered and subjected to a rotation which returns it to its initial position. Thus, if the second pattern to be projected is exactly positioned relative to the pattern previously projected, coincidence will be obtained.

The invention relates to a method of positioning the thin semiconductor plate relative to the pattern to be projected and repeated on that plate. The alignment method consists in applying at least one reference mark to each of the patterns to be projected, each pattern corresponding to a different level of the circuit, at locations which are intended to be superposed during the successive exposures, in recording the reference mark carried by the first pattern on the semiconductor plate during the formation of the first level of the circuit after photorepetition of the first pattern and then, after each repositioning of the plate, in illuminating a first elementary zone of the plate situated on one side thereof along a reference axis of the photorepeater in the plane of that plate by an auxiliary illuminating system and in forming on the following pattern positioned in the same way as the first pattern an image of the reference mark recorded in that zone, in making the imaged reference mark and the reference mark of the following pattern coincide by displacing the plate in its plane along two orthogonal axes X and Y characteristic of the photorepeater, in displacing the plate along the reference axis by a distance D until a second elementary zone on the other side of the plate is illuminated, in displacing the plate along the axes X and Y to make the imaged reference mark of the second zone coincide with the reference mark of the following pattern, the global displacement d thus effected, equal to $D \sin \alpha$, being measured, $\alpha$ being the angle of rotation of the plate relative to its initial position, and in rotating the plate in the plane X Y through the angle $\alpha$, a final displacement along the axes X and Y enabling the alignment of the plate and the pattern to be adjusted.

When the differences are thus corrected, the plate is in the same position which it occupied during the first exposure and it is then possible to project the second pattern by following the same pre-established control programme for positioning the plate. The same positioning process is applied before each level of the circuit is photorepeated.

The present invention also relates to a photorepeater carrying out this positioning method. This photorepeater comprises in particular an illumination and projection system intended to form the image of an elementary zone of the plate (or of part of an elementary zone) in the plane of the pattern to be projected, a system for displacing the plate along two orthogonal axes and for rotating it and a system for displaying the plane of the pattern.

For a better understanding of the invention and to show how the same may be carried into effect, reference will be made to the following description and the attached drawings among which:

FIG. 3 shows the successive positions of the reference marks in the plane of the pattern to be projected during the various stages of the alignment process.

Figure 1:
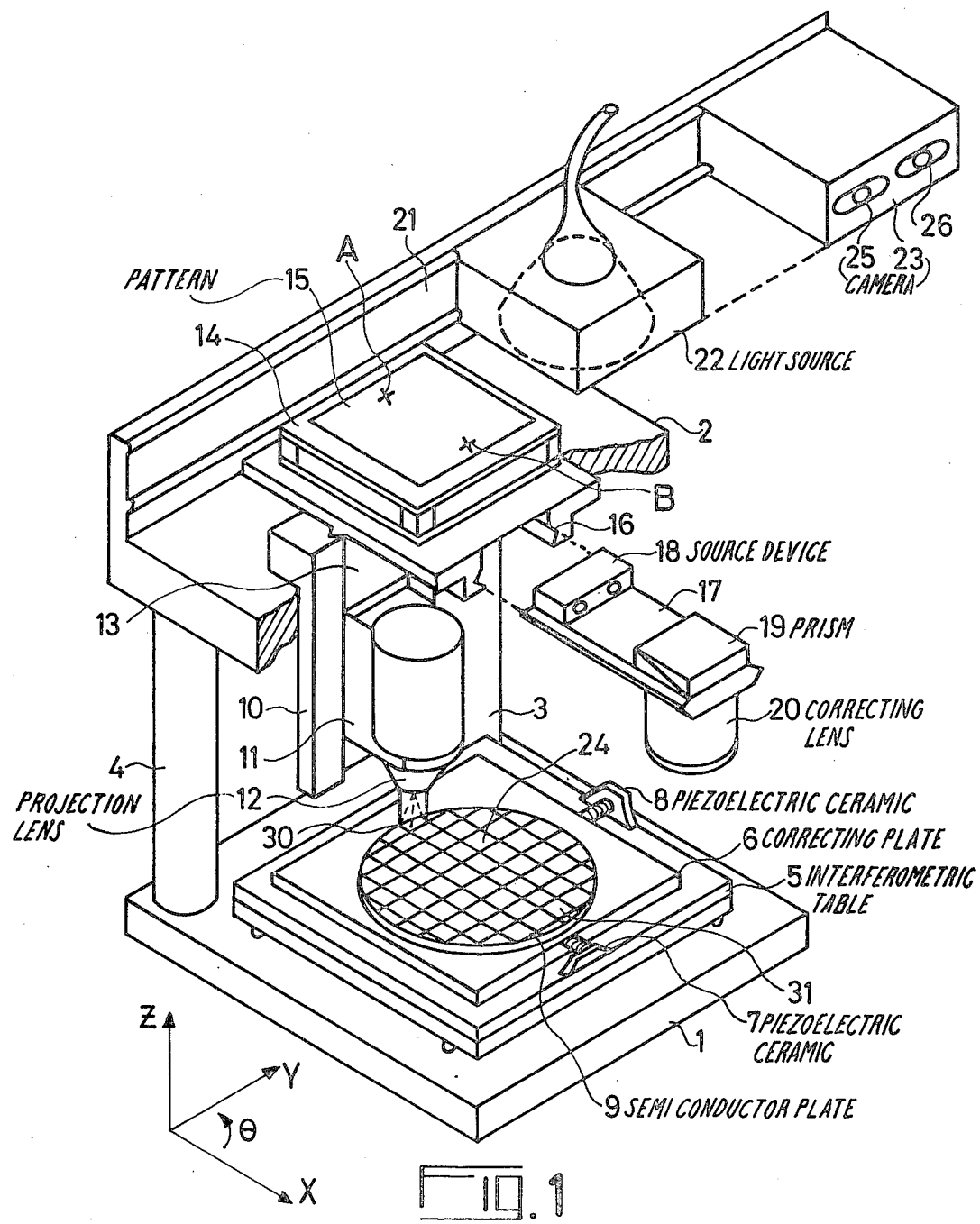
FIG. 1 is a perspective view showing the photorepeater according to the invention as a whole.

The photorepeater using the method of positioning the thin semiconductor plate relative to the pattern to be projected by reduction onto that plate is shown in FIG. 1.

It comprises a lower block 1 and an upper block 2, the upper block 2 being shown in part only so that the other elements of the photorepeater may be seen. These two blocks are kept at a constant distance from one another by at least two columns 3 and 4. The lower block 1 forms the base of an interferometric table 5 which is capable of being moved along two orthogonal axes X and Y.

The interferometric table carries a correcting plate 6 allowing movements of the order of 10 microns relative to the interferometric table. These movements are controlled by two groups of piezoelectric ceramics 7 and 8 which act respectively along the axes X and Y. The control of the cross-movement interferometric table 5 along two orthogonal axes X and Y is obtained by laser interferometry; the control circuits have not been shown in the plan of FIG. 1. Optical control is obtained by movable mirrors disposed on the lateral surfaces of the correcting plate 6 and the orthogonality of these lateral surfaces relative to the plane of the interferometric table is adjusted to within a second angle. The thin semiconductor plate 9 to be exposed, which is covered by a layer of photo-resist, is arranged on the correcting plate 6.

An optical system intended to project the pattern to be projected onto the thin plate is rendered integral with the upper block. It comprises a vertical bench 10 arranged on the upper block and comprising a runner system in which a lens holder 11 carrying the projection lens 12 and a reticule-carrying base 13 are able to slide along the axis Z. The reticule-carrying base supports a stage 14 which is capable of being displaced in the directions X and Y and rotated in the plane X Y relative to the upper block. The pattern 15 is itself arranged on this stage 14.

The reticule-carrying base and the stage each comprise a central opening through which the image of the reticule can be projected.

The reticule-carrying base comprises a runner 16 along which is able to slide a plate 17 comprising a two-source illuminating device 18, a prism 19 and a correcting lens 20.

The upper block also supports a vertical bench 21 comprising two horizontal runners in which a system comprising a light source 22 and a camera system 23 are able to slide along the axis Y. In the embodiment illustrated, the camera system comprises two cameras 25 and 26 of which the optical axes are parallel and of which the lenses may be spaced apart to a greater or lesser extent.

The mode of operation of the photorepeater for direct photorepetition is as follows: the circuit which it is desired to obtain in n copies on a thin semiconductor plate is the result of several exposures to light through a pattern (each followed by a chemical treatment—generally 8 to 14 operations). Each of the "levels" of the circuit corresponding to a particular pattern is outlined on a photosensitive support by optical or electronic composition. The photosensitive support with an image thus formed thereon represents the pattern to be projected on a reduced scale onto the thin semiconductor plate. To this end, the pattern 15 is placed on the stage 14. The stage 14 is adjustable along the two orthogonal axes X and Y and in its rotation in the plane X Y ($\theta$). The adjustment of this stage enables the pattern to be suitably positioned relative to the photorepeater. The light source 22 is then brought to the vertical of the pattern to be projected onto the thin plate. This source is an extended source of the mercury vapour lamp type emitting a beam of low divergence. By means of a filter (not shown in the drawings) situated at the output end of the mercury vapour lamp, it is possible to select that line of the spectrum of the lamp which corresponds to the best sensitivity for forming an image on the photosensitive resin covering the thin semiconductor plate. Generally an image is formed on the resin by blue light in the visible spectrum (435 nm in the embodiment). The optical projection system is primarily formed by a projection lens which has a magnification adapted to the desired scale of reduction and which projects the light onto an elementary zone, such as 24, of the semiconductor substrate covered with the layer of photosensitive resin on which an image is to be formed.

When an image has been formed on the resin in the illuminated elementary zone, the table is moved by stepping motors (for positioning to within a few microns), fine positioning being obtained by the piezoelectric ceramics in accordance with a pre-established programme enabling a regular matrix of circuits to be formed, with the result that all the elementary zones of the thin plate are successively exposed through the same pattern. The thin plate is then removed from its support, treated, covered with an other layer of photoresist and returned to a position near the first position. In general, it is not possible to reposition the thin plate with sufficient precision for the second pattern projected to be exactly positioned relative to the first with the required precision. The standard generally accepted for a correct superposition of the successive patterns is between 1/10 and 1/5 of the dimension of the smallest geometry to be recorded on the thin semiconductor plate. For details of 1 $\mu$m, the photorepeater should be able to position the thin plate and the successive patterns with a precision at least equal to 0.2 $\mu$m. Before exposure of the thin plate through a second pattern in accordance with the same pre-established programme as before, it is necessary on the one hand for the second pattern to be perfectly positioned relative to the first and, on the other hand, for the thin plate to be returned to the same position which it occupied during the first exposure. To this last end, two reference marks A and B carried by the pattern and aligned along an axis of the pattern, for example the axis X, are projected at the same time as the first pattern. During the development and chemical treatment of the thin plate, these reference marks are recorded in the semiconductor. The thin plate is then prepared for an other operation and, in particular, an other layer of photoresist is applied to the thin plate. The thin plate is then repositioned on the plate 6 in a position close to its first position. The second pattern on which reference marks complementary in configuration to the reference marks of the first pattern have been recorded, is placed on the stage 14 and the position of the pattern in conjunction with the position of the stage is regulated in such a way that the second pattern is positioned to within 0.15 $\mu$m in the same way as the first pattern relative to the photorepeater. The two-source illuminating system was positioned beforehand by sliding in the runner 16 in such a way that the prism 19 which receives light through two optical fibres (not shown) level with one surface of the block 18, reflects some of the light which it receives through the correcting lens 20 and the projection lens 12. The light conducted by the optical fibres is selected for not forming an image on the layer of photoresist applied to the thin plate and may be minimally absorbed by that resin.

The sources selected have a wavelength of 546 nm (in the green wavelengths of the visible spectrum). The correcting lens 20 is intended to correct the focussing error due to the use of this green light relative to the focussing adjusted for the blue light used for exposing the layer of photoresist.

Figure 2:
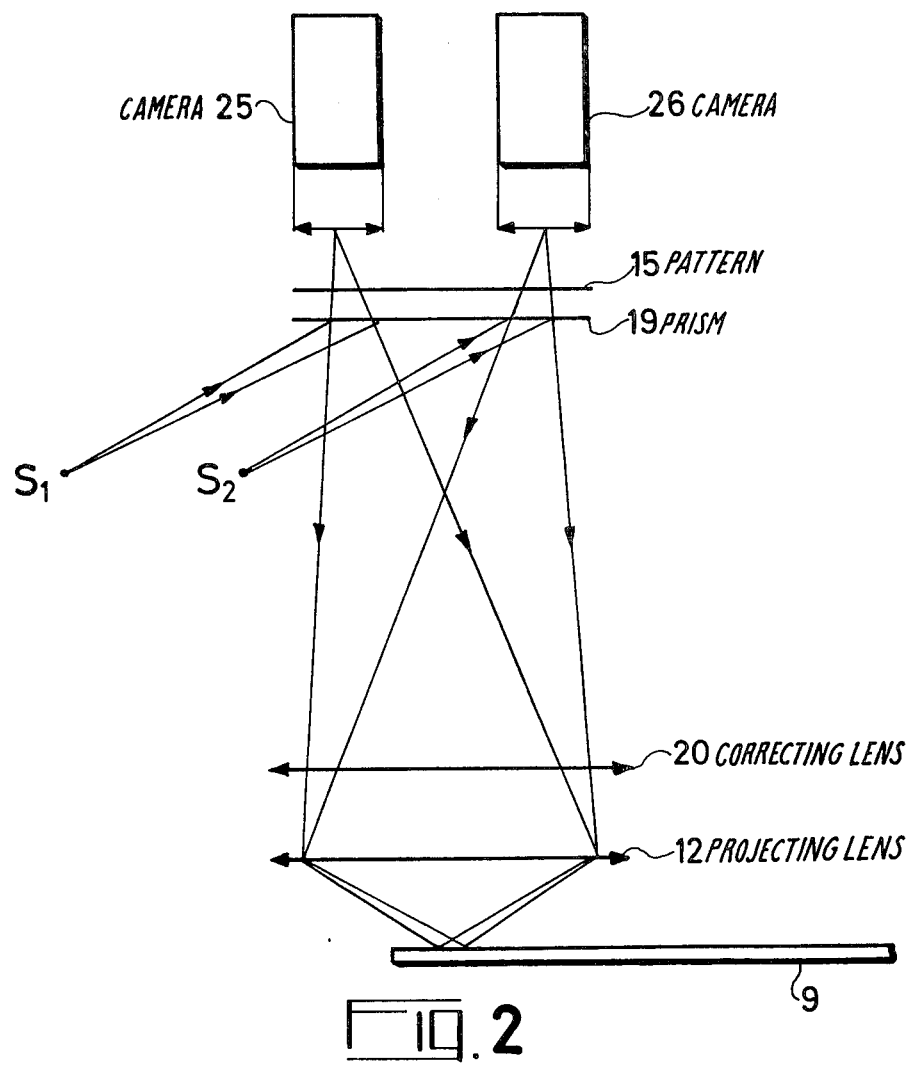
FIG. 2 is an optical plan of the positioning system using the aligning process according to the invention.

The optical projection system intended for illuminating the reference marks recorded on the thin plate and the optical display system are illustrated in FIG. 2 where the same elements as in FIG. 1 have been denoted by the same reference numerals.

The two sources $S_1$ and $S_2$ emit green light towards the prism 19 which partially reflects the light which it receives through the correcting lens 20 and the projection lens 12 aligned along the axis Z. Two small spots are thus projected onto the semiconductor plate. The distance between the two sources $S_1$ and $S_2$ is adjusted for the two spots to be spaced by the same distance as the reference marks recorded in an elementary zone of the thin plate. These images of the two spots projected onto an elementary zone are formed in the plane of the pattern 15 so that it is possible in that plane simultaneously to observe the images of the two reference marks of an elementary zone and the complementary reference marks of the pattern. These reference marks are observed by means of cameras 25 and 26 of which the lenses are positioned vertically of the pattern 15. By projecting the corresponding images onto a screen, it is possible to follow the relative movements of the reference marks recorded in an elementary zone and projected in the plane of the following pattern in relation to the reference marks belonging to that pattern. The arrangement has been described as comprising a system for forming images of two reference marks. In practice, the positioning method may be carried out with a single reference mark in each pattern, the second reference mark optionally being necessary in only the last phase of the positioning method. Accordingly, only the reference mark A will be used for the first steps of the method, the reference mark B having the same movement as the reference mark A.

In a first phase, the first pattern is projected onto the thin plate in accordance with a pre-established photorepetition programme. The pattern 15 comprises the reference marks A and B which are thus recorded in each elementary zone of the thin plate after the chemical treatment thereof. A layer of photoresist is deposited onto the thin plate carrying this first circuit level and the thin plate is returned to a position close to the initial position. The optical image-forming system comprising the sources $S_1$ and $S_2$, the prism 19, the correcting lens 20 and the lens 12 is positioned vertically of an elementary zone 30 of the thin plate situated at the edge thereof.

The first elementary zone imaged is preferable selected on an axis of displacement of the thin plate, for example the axis X. The image formed on a screen by the cameras is of the type shown in FIG. 3a. The imaged reference mark $A_1$ may be surrounded by auxiliary reference marks enabling the reference mark to be returned to the light spot by displacing the thin plate when the reference mark is too far from the spot projected onto the zone. The reference marks of the pattern are on the axis X due to the positioning of the pattern relative to the photorepeater. The imaged reference marks define the axis $X'_1$. A first displacement of the thin plate enables the reference mark $A_1$ to be brought to the centre of the corresponding reference mark of the pattern on the axis X, the axis $X'_1$ being translated into $X'_2$. The thin plate (or the optical image-forming system) is then displaced so as to form the images of the reference marks carried by a zone 31 (FIG. 1) diametrically opposite the zone 30 on the axis X, the zones 30 and 31 being separated by the distance D. The reference marks $A_2$ and $B_2$ of the zone 31 are themselves carried by the axis $X'_2$, as shown in FIG. 3b. The reference $A_2$ is then brought to the centre of the corresponding reference mark of the pattern carried on the axis X and the displacement d is measured, the axis $X'_2$ is then translated into $X'_3$. The angle of rotation $\alpha$ of the thin plate relative to its initial position is thus given by: $\alpha = \arcsin (d/D)$.

The thin plate is then turned in its plane X Y through an angle $\alpha$ and the axis $X'_3$ is brought to $X''$, the axis $X''$ then being parallel to the axis X. A final displacement along X Y enables the reference mark $A_2$ to be brought to the center of the corresponding reference mark of the pattern if a single reference mark is used, or enables the reference marks $A_2$ and $B_2$ to be centered relative to the corresponding reference marks of the pattern (as shown in FIG. 3c) in the event of variation of magnification by the optical system between the optical device for projecting the pattern and the optical device for projecting the viewing beam.

The positioning method may be taken up again for the zone 30 if the rotation is not sufficiently precise to ensure correct positioning in a single operation.

The invention is not limited to the positioning method and to the photorepeater using this method which have been described in details in the foregoing. In particular, as mentioned above, it is possible to use a single reference mark recorded on each pattern, in which case the auxiliary illuminating system would comprise a single source and the optical viewing system a single camera. The auxiliary illuminating system has been described as projecting one spot or two spots onto the thin semiconductor plate in dependence upon the number of reference marks. In fact, it is possible completely to illuminate an elementary zone, in which case the viewing system would be designed to form a global image of the pattern.

What we claim is:

1. A method of positioning a thin semi-conductor plate and patterns to be successively projected thereon on a reduced scale in elementary zones of the plate in a photorepeater, said patterns corresponding to successive different levels of a circuit to form on a reduced scale on said plate by direct photorepetition, said method comprising the successive steps of:

recording at least one reference mark on each of said patterns to be projected at places intended to be superposed during successive projections;

recording said reference mark carried by the first of said patterns in said plate during the formation of the first of said levels by photorepetition of said first pattern;

and, after each treatment and rough positioning of said plate in said photorepeater;

illuminating, by means of an auxiliary illuminating device, a first of said elementary zones, said first zone being situated on one side of said plate on a reference axis of said photorepeater;

forming on a following pattern, positioned in the same way as said first pattern, an image of said reference mark recorded in said zone;

centering said image of said reference mark and said reference mark carried by said following pattern by moving said plate in its plane along two orthogonal axes X and Y of said photorepeater;

moving said plate along said reference axis by a distance D until said auxiliary illuminating device illuminates a second elementary zone on the other side of said plate;

moving the thin plate along axes X and Y for centering the image of said reference mark of the second zone and said reference mark of the following pattern, the global displacement d thus effected equal to D sin $\alpha$ being measured, $\alpha$ being the angle of rotation of the thin plate relative to its initial position;

rotating the thin plate in the plane X Y of the angle $\alpha$;

and finally moving the plate along axes X and Y enabling the alignment of said plate and said pattern to be adjusted.

2. A method as set forth in claim 1, wherein a single reference mark is recorded on each pattern and in said plate, wherein:

final moving of the thin plate brings the image of said reference mark of the elementary zone and the reference mark of the pattern into coincidence with one another.

3. A method as set forth in claim 1 wherein two reference marks are recorded on each pattern, positioning method taking into account one of the two reference marks up to the final moving, wherein:

final moving enables the two images of said reference marks of the second elementary zone to be centered relative to the two reference marks recorded on the pattern.

4. A method as set forth in claim 1 wherein said reference axis is one of the axes X and Y of the photorepeater.

5. A photorepeater for carrying out a method of positioning a thin semiconductor plate and successive patterns, at least a reference mark being recorded on each of the patterns to be projected on said plate at places intended to be superposed during successive exposures, the reference mark carried by the first pattern being recorded on said plate during the formation of the first level of the circuit by photorepetition of the first pattern, comprising for carrying out the positioning method:

an auxiliary illuminating device which supplies light for imaging the reference marks recorded on said successive patterns;

projecting means for projecting this light onto said thin semiconductor plate, an optical image-forming device for forming the image of at least one reference mark recorded on the thin plate in the plane of the patterns;

a display system for simultaneously displaying the imaged reference mark and the reference mark carried by the pattern;

and positioning means for moving said plate along a reference axis and along two orthogonal axes, said positioning means comprising centering means to move said plate such that said imaged reference mark of a first zone of said plate and said reference mark carried by the pattern are in coindicence, translating means for moving said plate along said reference axis to a second zone, a distance D apart the first zone, centering means to move said plate a distance d such that said imaged reference mark of said second zone and said reference mark of said pattern are in coincidence, rotating means to rotate said plate about said reference mark of said second zone an angle $\alpha = \arcsin(d/D)$, and adjustement positioning means to move said plate for adjusting the positioning of said imaged reference mark relative to the reference mark carried by the pattern.

6. A photorepeater as claimed in claim 5, wherein where the positioning method takes into account two reference marks recorded on each pattern and on the thin semiconductor plate, said auxiliary illuminating device comprises two sources, said projecting means projecting onto an elementary zone to be viewed two spots separated by a distance equal to the distance between two reference marks recorded in each elementary zone, said successive patterns each comprising two reference marks.

7. A photorepeater for carrying out a method of positioning a thin semiconductor plate and successive patterns, at least a reference mark being recorded on each of the patterns to be projected on said plate at places intended to be superposed during successive exposures, the reference mark carried by the first pattern being recorded on said plate during the formation of the first level of the circuit by photorepetition of the first pattern, comprising for carrying out the positioning method:

an auxiliary illuminating device which supplies light for imaging the reference marks recorded on said successive patterns, said light having a wavelength such that it does not act on the layers of photoresist deposited on said plate during said treatment;

projecting means for projecting this light onto said thin semiconductor plate, an optical image-forming device for forming the image of at least one reference mark recorded on the thin plate in the plane of the patterns;

a display system for simultaneously displaying the imaged reference mark and the reference mark carried by the pattern;

and positioning means for moving said plate along a reference axis and along two orthogonal axes, said positioning means comprising centering means to move said plate such that said imaged reference mark of a first zone of said plate and said reference mark carried by the pattern are in coincidence, translating means for moving said plate along said reference axis to a second zone, a distance D apart the first zone, centering means to move said plate a distance d such that said imaged reference mark of said second zone and said reference mark of said pattern are in coincidence, rotating means to rotate said plate about said reference mark of said second zone an angle $\alpha = \arcsin(d/D)$, and adjustement positioning means to move said plate for adjusting the positioning of said imaged reference mark relative to the reference mark carried by the pattern.

8. A photorepeater as claimed in claim 7, wherein said projecting means comprises a projection optical device used for projecting the patterns to be photorepeated onto the thin plate, and an optical device for correcting focussing errors which corrects the focussing error due to the use of light of different wavelengths for exposing the thin plate and for projecting reference marks.

9. A photorepeater as claimed in claim 8, wherein said display system comprises at least one camera.

* * * * *